US012772471B2

(12) United States Patent
Tseng et al.

(10) Patent No.: US 12,772,471 B2
(45) Date of Patent: Oct. 20, 2026

(54) METHOD FOR MANUFACTURING INSULATED GATE BIPOLAR TRANSISTOR WITH LASER PRE-TREATMENT PROCESS

(71) Applicant: Mosel Vitelic Inc., Hsinchu (TW)

(72) Inventors: Ta-Wei Tseng, Hsinchu (TW); Yun-Kuei Chiu, Hsinchu (TW); Chun-Sheng Chen, Hsinchu (TW)

(73) Assignee: Mosel Vitelic Inc., Hsinchu (TW)

( * ) Notice: Subject to any disclaimer, the term of this patent is extended or adjusted under 35 U.S.C. 154(b) by 352 days.

(21) Appl. No.: 18/425,007

(22) Filed: Jan. 29, 2024

(65) Prior Publication Data

US 2024/0405095 A1 Dec. 5, 2024

(30) Foreign Application Priority Data

Jun. 2, 2023 (TW) ................................. 112120662

(51) Int. Cl.
*H10D 12/01* (2025.01)
*H10D 12/00* (2025.01)

(52) U.S. Cl.
CPC ......... *H10D 12/032* (2025.01); *H10D 12/441* (2025.01)

(58) Field of Classification Search
CPC .. H10D 12/032; H10D 12/441; H10D 12/417; H10P 34/42
See application file for complete search history.

(56) References Cited

U.S. PATENT DOCUMENTS

| | | | | |
|---|---|---|---|---|
| 9,520,479 | B1 * | 12/2016 | Chen | H10D 62/60 |
| 10,629,686 | B2 | 4/2020 | Pham et al. | |
| 10,755,933 | B2 | 8/2020 | Takishita et al. | |
| 11,715,669 | B2 * | 8/2023 | Lee | H10W 20/023 438/667 |
| 2008/0158138 | A1 * | 7/2008 | Yamazaki | G02F 1/13318 349/116 |
| 2008/0277753 | A1 * | 11/2008 | Bui | H10F 39/107 257/E27.129 |
| 2010/0065939 | A1 * | 3/2010 | Bui | H10F 39/189 438/73 |
| 2012/0292728 | A1 * | 11/2012 | Tsai | H10F 39/8053 257/E31.127 |
| 2014/0327118 | A1 * | 11/2014 | Chang | H10D 12/032 438/494 |
| 2015/0031174 | A1 * | 1/2015 | Pan | H10D 12/441 438/135 |
| 2015/0279980 | A1 * | 10/2015 | Chen | H10D 12/461 438/138 |

(Continued)

*Primary Examiner* — Caleb E Henry
(74) *Attorney, Agent, or Firm* — KIRTON McCONKIE; Evan R. Witt

(57) ABSTRACT

A method for manufacturing an insulated gate bipolar transistor includes (a) providing a substrate comprising a front side and a back side; (b) forming at least one front side element and at least one front side metal layer on the front side of the substrate; (c) performing a thinning process on the back side of the substrate; (d) performing a laser pre-treatment process on the back side of the substrate; (e) performing at least one ion doping process on the back side of the substrate for forming at least one ion doping layer; (f) performing an annealing process on the back side of the substrate; and (g) forming a collector metal layer on the back side of the substrate.

6 Claims, 2 Drawing Sheets

(56) References Cited

U.S. PATENT DOCUMENTS

| | | | | |
|---|---|---|---|---|
| 2016/0133733 | A1* | 5/2016 | Chang .................. | H10D 12/038<br>438/135 |
| 2020/0090937 | A1 | 3/2020 | Nakata | |
| 2020/0105874 | A1* | 4/2020 | Yilmaz ................ | H10D 12/481 |
| 2021/0313423 | A1 | 10/2021 | Yilmaz | |
| 2023/0049926 | A1 | 2/2023 | Ganagona et al. | |

* cited by examiner

METHOD FOR MANUFACTURING INSULATED GATE BIPOLAR TRANSISTOR WITH LASER PRE-TREATMENT PROCESS

CROSS-REFERENCE TO RELATED APPLICATION

This application claims priority to Taiwan Patent Application No. 112120662, filed on Jun. 2, 2023. The entire contents of the above-mentioned patent application are incorporated herein by reference for all purposes.

FIELD OF THE INVENTION

The present disclosure relates to a method for manufacturing an insulated gate bipolar transistor, and more particularly to a method for manufacturing an insulated gate bipolar transistor with stable electrical characteristics.

BACKGROUND OF THE INVENTION

Insulated gate bipolar transistor (IGBT) device is a semiconductor device combining the features of bipolar junction transistor (BJT) and metal-oxide-semiconductor field effect transistor (MOSFET). The IGBT device has both advantages of MOSFET and BJT and is thus extensively used in various applications.

Please refer to FIG. 1 which is a flow chart showing a conventional method for manufacturing an IGBT device. As shown in FIG. 1, in step S101, front side elements and front side metal layers are formed on a front side of a substrate. In step S102, a thinning process is performed on a back side of the substrate, in step S103, an ion doping process is performed on the thinned back side of the substrate, and in step S104, an annealing process is performed on the back side of the substrate. Then, in step 105, a collector metal layer is formed on the back side of the substrate for completing the manufacture of the IGBT device.

As known, the thinning process is an essential and critical step which influences the performance of the IGBT device. Currently, grinding is mostly utilized to reduce the thickness of the substrate. However, since the grinding process causes stresses and damages to the backside of the substrate, even after the stress is relieved, defects still will be present on the back side of the substrate, for example, micro-cracks and crystal dislocations are easily left on the subsurface of the back side of the substrate. Further, these defects might affect the electrical characteristics of the formed IGBT device.

Therefore, there is a need of providing a method for manufacturing an insulated gate bipolar transistor for improving the problems in the prior art.

SUMMARY OF THE INVENTION

An object of the present disclosure is to provide a method for manufacturing an insulated gate bipolar transistor which additionally includes a laser pre-treatment process after the thinning process for removing the defects formed on the back side of the substrate due to the thinning process, so as to increase the stability of electrical characteristics of the formed IGBT devices and also effectively improve the quality of the formed IGBT devices.

In accordance with an aspect of the present disclosure, a method for manufacturing an insulated gate bipolar transistor is provided. The method includes (a) providing a substrate comprising a front side and a back side; (b) forming at least one front side element and at least one front side metal layer on the front side of the substrate; (c) performing a thinning process on the back side of the substrate; (d) performing a laser pre-treatment process on the back side of the substrate; (e) performing at least one ion doping process on the back side of the substrate for forming at least one ion doping layer; (f) performing an annealing process on the back side of the substrate; and (g) forming a collector metal layer on the back side of the substrate.

In an embodiment, the laser pre-treatment process is performed through a green laser.

In an embodiment, the laser pre-treatment process is performed at a temperature ranged from about 1000° C. to about 1500° C.

In an embodiment, the laser pre-treatment process is performed in a time period ranged from about 60 seconds to about 150 seconds.

In an embodiment, the at least one ion doping layer comprises a field stop layer, and the insulated gate bipolar transistor is a field stop insulated gate bipolar transistor.

In an embodiment, the substrate is an N type substrate or a P type substrate.

BRIEF DESCRIPTION OF THE DRAWINGS

The above contents of the present disclosure will become more readily apparent to those ordinarily skilled in the art after reviewing the following detailed description and accompanying drawings, in which.

DETAILED DESCRIPTION OF THE PREFERRED EMBODIMENT

The present disclosure will now be described more specifically with reference to the following embodiments. It is to be noted that the following descriptions of preferred embodiments of this disclosure are presented herein for purpose of illustration and description only. It is not intended to be exhaustive or to be limited to the precise form disclosed.

Figure 1:
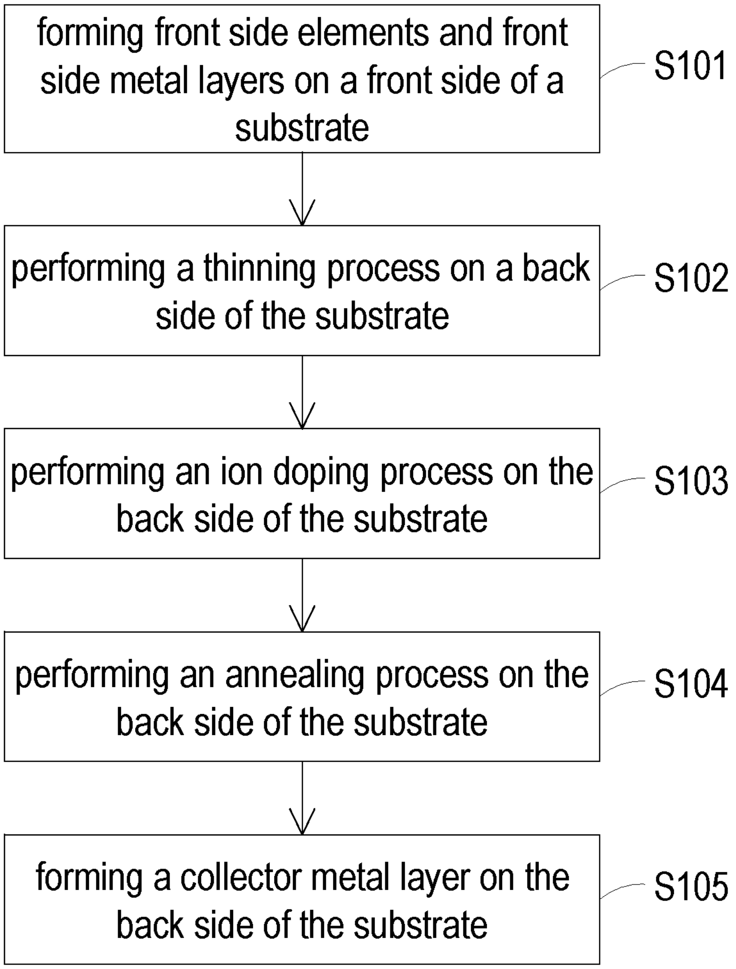
FIG. 1 PRIOR ART
FIG. 1 is a flow chart showing a conventional method for manufacturing an IGBT device.
Figure 2:
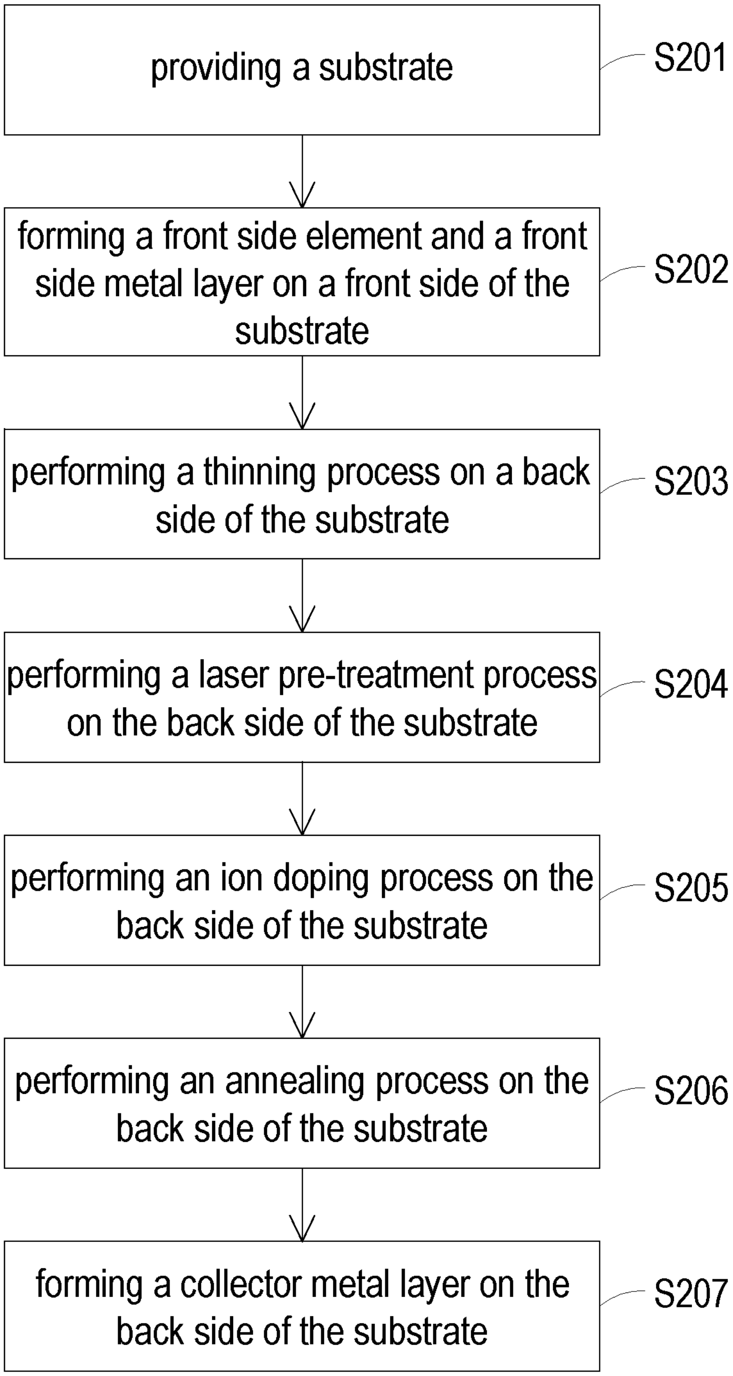
FIG. 2 is a flow chart showing a method for manufacturing an IGBT device according to an embodiment of the present disclosure.

Please refer to FIG. 2, which shows a method for manufacturing an IGBT device according to an embodiment of the present disclosure. As shown in FIG. 2, at first, in step S201, a substrate is provided, and in step S202, front side elements and front side metal layers are formed on a front side of the substrate. Then, processes performed on a back side of the substrate are followed. In step S203, a thinning process is performed on the back side of the substrate to reduce a thickness of the substrate to a desired value. In step S204, a laser pre-treatment process is performed on the back side of the substrate. In step S205, at least one ion doping process is performed on the back side of the substrate for forming at least one ion doped layer. In step S206, an annealing process is performed on the back side of the substrate. Then, in step S207, a collector metal layer is formed on the back side of the substrate. Through the steps above, the IGBT device with stable electrical characteristics according to the present disclosure is formed.

In steps S201-S202, preferably but not exclusively, the substrate can be an N type silicon substrate or a P type silicon substrate, and the front side elements and the front side metal layers can be varied depending on practical requirements. In step S203, preferably but not exclusively, the thinning process is performed through grinding, but not limited thereto. In step S205, the ion doping process is selected in accordance with the type of IGBT device. For example, the ion doping layer for the FS IGBT (Field Stop IGBT) device includes a field stop layer, and other IGBT devices, such as, NPT IGBT (Non-Punch Through IGBT), Trench IGBT and FS Trench IGBT (Field Stop Trench IGBT), respectively include a corresponding arrangement of ion doping layer(s). Further, depending on the substrate is an N type or P type silicon substrate and the arrangement of ion doping layer(s), the doped ion is selected to be P and/or N ion(s). In step S206, preferably but not exclusively, the annealing process is a laser annealing process or a gas annealing process, but not limited thereto.

In accordance with the descriptions above, compared with the prior art, a laser pre-treatment process, namely step S204, is added in the present method for manufacturing the IGBT device. This laser pre-treatment process is performed after the thinning process, and the function thereof is to remove the defects which are left in the subsurface of the back side of the substrate due to the thinning process. As known, thinning of the substrate is a critical and important process for the IGBT device. However, the extremely thin thickness of the thinned substrate also might cause broken easily. The left defects on the thinned substrate just further increase the broken possibility of the thinned substrate, for example, the substrate might be therefore more easily broken in the sequential processes. Moreover, even the sequential processes have completed, the defects remain in the substrate still will influence the electrical characteristics, the qualities and also the consistency of the formed IGBT devices. In other words, since the locations of the defects in the substrate are random, the influences thereof are not predictable, and thus, it also has difficulties in controlling and maintaining the quality of the formed IGBT devices. Consequently, performing the pre-treatment on the grinded back side of the substrate first after the thinning process can effectively remove the defected formed in the substrate, thereby not only reducing the broken possibility of the substrate, but also improving the stability of electrical characteristics and the consistency of the formed IGBT devices.

The laser pre-treatment process adopts a green laser, for example, a laser with a wavelength ranged from about 495 nm to about 570 nm. In a preferable embodiment, the wavelength of the green laser is about 532 nm. The temperature of the laser pre-treatment process is ranged from about 1000° C. to about 1500° C. In a preferable embodiment, the performing temperature is ranged from about 1200° C. to about 1300° C. The irradiation time period of the green laser is ranged from about 60 seconds to about 150 seconds, and preferably, the irradiation time period is ranged from about 60 seconds to about 90 seconds. In this way, an effect of removing the defects formed at the back side of the substrate during the thinning process can be achieved. For example, the micro-cracks and crystal dislocations can be removed through the laser pre-treatment process, so as to significantly reduce the damages to the substrate. Base on the substrate that the defects therein are removed, the formed IGBT devices through the steps S205 to S207 can provide more stable electrical characteristics and maintain the reproducibility and consistency of product quality. In addition, because the irradiation time period of the laser pre-treatment is short, the front side elements and front side metal layers are not influenced thereby. Consequently, this laser pre-treatment process is a low cost and easily performed process and can specifically achieve the effect of removing the defects.

In conclusion, the method for manufacturing an insulated gate bipolar transistor according to the present disclosure achieves the effect of removing the defects formed at the back side of the substrate during the thinning process through adding a laser pre-treatment process after the thinning process and before the sequential back side processes, thereby significantly increasing the stability of electrical characteristics of the formed IGBT devices and also effectively improving the reproducibility and consistency of product quality thereof.

While the disclosure has been described in terms of what is presently considered to be the most practical and preferred embodiments, it is to be understood that the disclosure needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A method for manufacturing an insulated gate bipolar transistor, comprising:

(a) providing a substrate comprising a front side and a back side;
(b) forming at least one front side element and at least one front side metal layer on the front side of the substrate;
(c) performing a thinning process on the back side of the substrate;
(d) subsequent to step (c), performing a laser pre-treatment process on the back side of the substrate;
(e) subsequent to step (d), performing at least one ion doping process on the back side of the substrate for forming at least one ion doping layer;
(f) performing an annealing process on the back side of the substrate; and
(g) forming a collector metal layer on the back side of the substrate.

2. The method for manufacturing the insulated gate bipolar transistor as claimed in claim 1, wherein the laser pre-treatment process is performed through a green laser.

3. The method for manufacturing the insulated gate bipolar transistor as claimed in claim 1, wherein the laser pre-treatment process is performed at a temperature ranged from about 1000° C. to about 1500° C.

4. The method for manufacturing the insulated gate bipolar transistor as claimed in claim 1, wherein the laser pre-treatment process is performed in a time period ranged from about 60 seconds to about 150 seconds.

5. The method for manufacturing the insulated gate bipolar transistor as claimed in claim 1, wherein the at least one ion doping layer comprises a field stop layer, and the insulated gate bipolar transistor is a field stop insulated gate bipolar transistor.

6. The method for manufacturing the insulated gate bipolar transistor as claimed in claim 1, wherein the substrate is an N type substrate or a P type substrate.

* * * * *